United States Patent
Yamada et al.

(10) Patent No.: US 7,420,860 B2
(45) Date of Patent: Sep. 2, 2008

(54) SEMICONDUCTOR MEMORY HAVING A DUMMY SIGNAL LINE CONNECTED TO DUMMY MEMORY CELL

(75) Inventors: Shinichi Yamada, Kawasaki (JP); Waichiro Fujieda, Kawasaki (JP); Shinichiroh Ikemasu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/707,128

(22) Filed: Feb. 16, 2007

(65) Prior Publication Data

US 2007/0147146 A1  Jun. 28, 2007

Related U.S. Application Data

(62) Division of application No. 11/002,894, filed on Dec. 3, 2004, now Pat. No. 7,184,333.

(30) Foreign Application Priority Data

May 18, 2004 (JP) .............................. 2004-148000

(51) Int. Cl.
*G11C 7/00* (2006.01)
(52) U.S. Cl. ...................... 365/201; 365/191; 365/203; 365/210.1

(58) Field of Classification Search ................. 365/191, 365/201, 230, 210.1
See application file for complete search history.

(56) References Cited

U.S. PATENT DOCUMENTS

| 6,337,814 | B1 * | 1/2002 | Tanida et al. ............ 365/189.09 |
| 6,580,649 | B2 * | 6/2003 | Park ...................... 365/189.07 |
| 6,839,293 | B2 * | 1/2005 | Kawamoto et al. ...... 365/189.15 |

FOREIGN PATENT DOCUMENTS

| JP | 2000-207899 | 7/2000 |
| JP | 2001-351399 | 12/2001 |

* cited by examiner

*Primary Examiner*—Hoai V Ho
(74) *Attorney, Agent, or Firm*—Arent Fox LLP (57) ABSTRACT

First dummy memory cells connected to a first dummy signal line have the same shape and characteristics as those of a real memory cell. The first dummy memory cells are arranged to be adjacent to outermost real memory cells. A voltage setting circuit changes the voltage of the first dummy signal line from a first voltage to a second voltage in order to write test data onto the first dummy memory cell during a test mode. By writing data of a logic opposite to that of the test data onto the real memory cell adjacent to the first dummy memory cell by means of an operation control circuit, a leak failure that may occur between the first dummy memory cell and the real memory cell adjacent thereto can be checked.

15 Claims, 10 Drawing Sheets

SEMICONDUCTOR MEMORY HAVING A DUMMY SIGNAL LINE CONNECTED TO DUMMY MEMORY CELL

CROSS REFERENCE TO RELATED APPLICATION

This application is a divisional of U.S. patent application Ser. No. 11/002,894, filed Dec. 3, 2004, now U.S. Pat. No. 7,184,333, which is based upon and claims the benefit of priority from Japanese Patent Application No. 2004-148000, filed on May 18, 2004, the entire contents of which are incorporated herein by reference.

BACKGROUND OF THE INVENTION

1. Field of the Invention

The present invention relates to a technique for surely detecting a failure of a memory cell of a semiconductor memory.

2. Description of the Related Art

A memory cell array of a semiconductor memory includes a plurality of memory cells arranged in a matrix and wirings (word lines and bit lines) for connecting those memory cells to a word decoder, a sense amplifier, and the like. In the memory cell array, elements and wirings are arranged with higher density, as compared with those in circuits near the memory cell array. In other words, the layout density of the elements and wirings on the inside of the memory cell array is different from that on the outside thereof. Thus, the shapes of the elements and wirings in an inner region of the memory cell array may be different from those in an outer peripheral region because of halation or the like in a fabrication process. Such a difference of the shapes may cause a short failure and a disconnection failure, thus reducing a yield.

According to a conventional technique, in order to make the shapes of the elements and wirings in the inner region of the memory cell array the same as those in the outer peripheral region so as to increase the yield, dummy memory cells and a dummy wiring (such as a dummy word line) are formed in the outer peripheral region of the memory cell array. Onto the dummy memory cell, no data has to be written (i.e., the dummy cell is not accessed), as described in Japanese Unexamined Patent Application Publications Nos. 2000-207899 and 2001-351399, for example. Therefore, the dummy memory cell is formed to have a simpler structure than that of a memory cell onto which given data is written (i.e., real memory cell).

SUMMARY OF THE INVENTION

It is an object of the present invention to surely extract a failure of a memory cell arranged in an outer periphery region of a memory cell array.

It is another object of the present invention to apply sufficient stress to all memory cells in an acceleration test.

In a semiconductor memory according to one aspect of the present invention, real signal lines are connected respectively to a plurality of real memory cell rows each of which is formed of real memory cells arranged in one direction. The first dummy signal line is wired along the real signal lines on the outside of a region in which the real memory cells are arranged. The first dummy memory cells are connected to the first dummy signal line, so that a predetermined logical level can be written onto the first dummy memory cells during a test mode. The first dummy memory cells have the same shape and characteristics as those of the real memory cells and are arranged adjacent to the real memory cells. A voltage setting circuit sets the first dummy signal line to the first voltage in order to keep the first dummy memory cell in a non-written state during a normal operation mode. Moreover, the voltage setting circuit sets the first dummy signal line to the second voltage in order to write test data onto the first dummy memory cell during the test mode. By writing data of a logic that is opposite to that of the test data onto the real memory cell adjacent to the first dummy memory cell by means of an operation control circuit, it is possible to check a leak failure that may occur between the real memory cell and the first dummy memory cell that are adjacent to each other. In other words, it is possible to detect a failure of the outermost real memory cell, which cannot be detected by the conventional technique. Thus, it is possible to remove a semiconductor memory having the aforementioned leak failure as a defective product in the first half of a test process consisting of a plurality of tests, which can eliminate the necessity to test such a defective product in the latter half of the test process and thereby reduce a test cost. Moreover, it is also possible to prevent the semiconductor memory having the leak failure from being shipped to the market.

In a preferred example of the semiconductor memory according to one aspect of the present invention, the real memory cells and first dummy memory cells are dynamic memory cells each of which includes a capacitor for holding data as electric charges and a transfer transistor turning on to charge/discharge the capacitor. The dynamic memory cell holds data by electric charges stored in the capacitor. Thus, in the case where there is a leak failure between the real memory cell and the first dummy memory cell, the data held in the real memory cell is lost. However, the aforementioned leak failure checking makes it possible to reliably detect the leak failure between the capacitors of the real memory cell and of the first dummy memory cell adjacent to each other. In other words, it is able to reliably detect a failure relating to the characteristics of the capacitor of the outermost real memory cell. The capacitor is formed to have opposite electrodes with large areas in a small region in order to improve the data retention characteristics. Thus, in general, the capacitor has a complex three-dimensional shape. Between the capacitors adjacent to each other, a slight change in a fabrication condition may cause a leak failure; therefore, the leak failure detection is very important.

In a preferred example of the semiconductor according to one aspect of the present invention, a test terminal receives a predetermined voltage during the test mode. The voltage setting circuit outputs the second voltage to the first dummy signal line in accordance with the predetermined voltage received by the test terminal. Thus, the aforementioned leak failure checking can be easily carried out by connecting the test terminal to an LSI tester or the like.

In a preferred example of the semiconductor memory according to one aspect of the present invention, a command decoder decodes a command signal. The operation control circuit accesses a real memory cell when receiving an access command via the command decoder. When receiving a test command via the command decoder, the operation control circuit shifts the semiconductor memory from the normal operation mode to the test mode and changes the voltage output from the voltage setting circuit from the first voltage to the second voltage. Since the aforementioned leak failure can be checked using the test command, no dedicated test terminal is required. The leak failure can be checked only with a terminal used in the normal operation mode. Therefore, the increase of the chip size of the semiconductor memory can be prevented.

In a preferred example of the semiconductor memory according to one aspect of the present invention, the test mode is a burn-in test mode in which the semiconductor memory is operated at a high temperature and a high voltage in order to remove an initial failure product. The leak failure is a margin failure. In the case where the semiconductor memory has a leak failure, the leakage amount may increase as it continuously operates (i.e., given stress). A semiconductor memory including a defective real memory cell is removed as a defective product through the burn-in test so that it is possible to prevent a leak failure being found on the market.

In a preferred example of the semiconductor memory according to one aspect of the present invention, the second dummy signal line is arranged on the outside of the first dummy signal line and is fixed to the third voltage. The second dummy memory cell is connected to the second dummy signal line. The detection of the leak failure can be achieved by writing data, which is opposite to data to be written onto a real memory cell, only onto the first memory cell adjacent to this real memory cell. In what state the second dummy memory cells not adjacent to the real memory cell are, is not relevant. Since it is not necessary to change the voltage of the second dummy signal line from the first voltage to the second voltage, drivability of the voltage setting circuit can be minimized. Therefore, the circuit scale of the voltage setting circuit can be made smaller and the chip size of the semiconductor memory can be reduced.

In a preferred example of the semiconductor memory according to one aspect of the present invention, the real memory cells and first dummy memory cells each includes a memory element and a transfer switch connected to the memory element. The real signal line is a real word line connected to control terminals of the transfer switches of the real memory cells. The first dummy line is a dummy word line connected to control terminals of the transfer switches of the first dummy memory cells. The first voltage is a voltage for turning off the transfer switch of the first dummy memory cell, while the second voltage is a voltage for turning it on. Thus, during the test mode, the aforementioned leak failure can be detected by setting the dummy word line to the second voltage, turning on the transfer switch of the first dummy memory cell to write test data onto the first dummy memory cell, and writing data having a logic that is opposite to that of the test data onto the real memory cell adjacent to the first dummy memory cell by using the operation control circuit. During the normal operation mode, the dummy word line is set to the voltage for turning off the transfer switch. Therefore, no data is written onto the first dummy memory cell. This can prevent strong stress from being applied to between the real memory cell and the first dummy memory cell that are adjacent to each other.

In a preferred example of the semiconductor memory according to one aspect of the present invention, the real memory cells and first dummy memory cells each includes a memory element and a transfer switch connected to the memory element. The real signal line is a real bit line connected to the transfer switches of the real memory cells. The first dummy signal line is a dummy bit line connected to the transfer switches of the first dummy memory cells. The first voltage is a precharge voltage that is a reset voltage for the real bit lines and the dummy bit line. The second voltage is a voltage for writing a high logical level onto the real memory cell and the first dummy memory cell. Thus, during the test mode, the aforementioned leak failure can be detected by setting the dummy bit line to the second voltage, writing test data onto the first dummy memory cell, and writing data having a logic opposite to that of the test data onto the real memory cell adjacent to the first dummy memory cell by means of the operation control circuit. During the normal operation mode, the dummy bit line is set to the precharge voltage. Therefore, it is possible to prevent strong stress from being applied to between the real memory cell and the first dummy memory cell that are adjacent to each other.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The present invention was made for overcoming the following problems.

In general, in a test process for a semiconductor memory, a test in which data having opposite logics is written onto adjacent memory cells, respectively, is carried out for removing a chip having a failure caused by data leak between the adjacent memory cells. In addition, in order to prevent the occurrence of the aforementioned failure on the market (i.e., in order to remove in advance a semiconductor memory in which the aforementioned failure will occur), an acceleration test (e.g., burn-in test) is carried out. In the acceleration test, data having opposite logics is written onto the adjacent memory cells by using a voltage that is not applied in normal read and write operation.

However, on the outside of a memory cell in an outer peripheral region of a memory cell array, a dummy memory cell is arranged. Thus, for the memory cell in the outer peripheral region of the memory cell array, data leak between the memory cells cannot be checked sufficiently, unlike that for the memory cell in the inner region. Therefore, in the test process that is formed by a plurality of tests, a failure caused by abnormal leak between the memory cells may be found in a latter half. In this case, the test performed before the failure was found comes to nothing, thus increasing a test cost. Especially, in the case where a leak failure was found in a semiconductor memory including a redundant circuit for repairing the failure in a test performed after the repair, a process for cutting a fuse and the like come to nothing. This largely affects the test cost. Moreover, in the case where the aforementioned leak failure cannot be detected by the acceleration test, the failure may occur on the market.

Preferred embodiments of the present invention will now be described referring to the drawings. A double circle in the drawings represents an external terminal. A signal line shown with bold line in the drawings is formed by a plurality of lines. A part of a block to which bold line is connected is formed by a plurality of circuits. A signal supplied via an external terminal is labeled with the same reference symbols as those of the external terminal. A signal line that transmits a signal is labeled with the same reference symbols as those of the signal.

Figure 1:
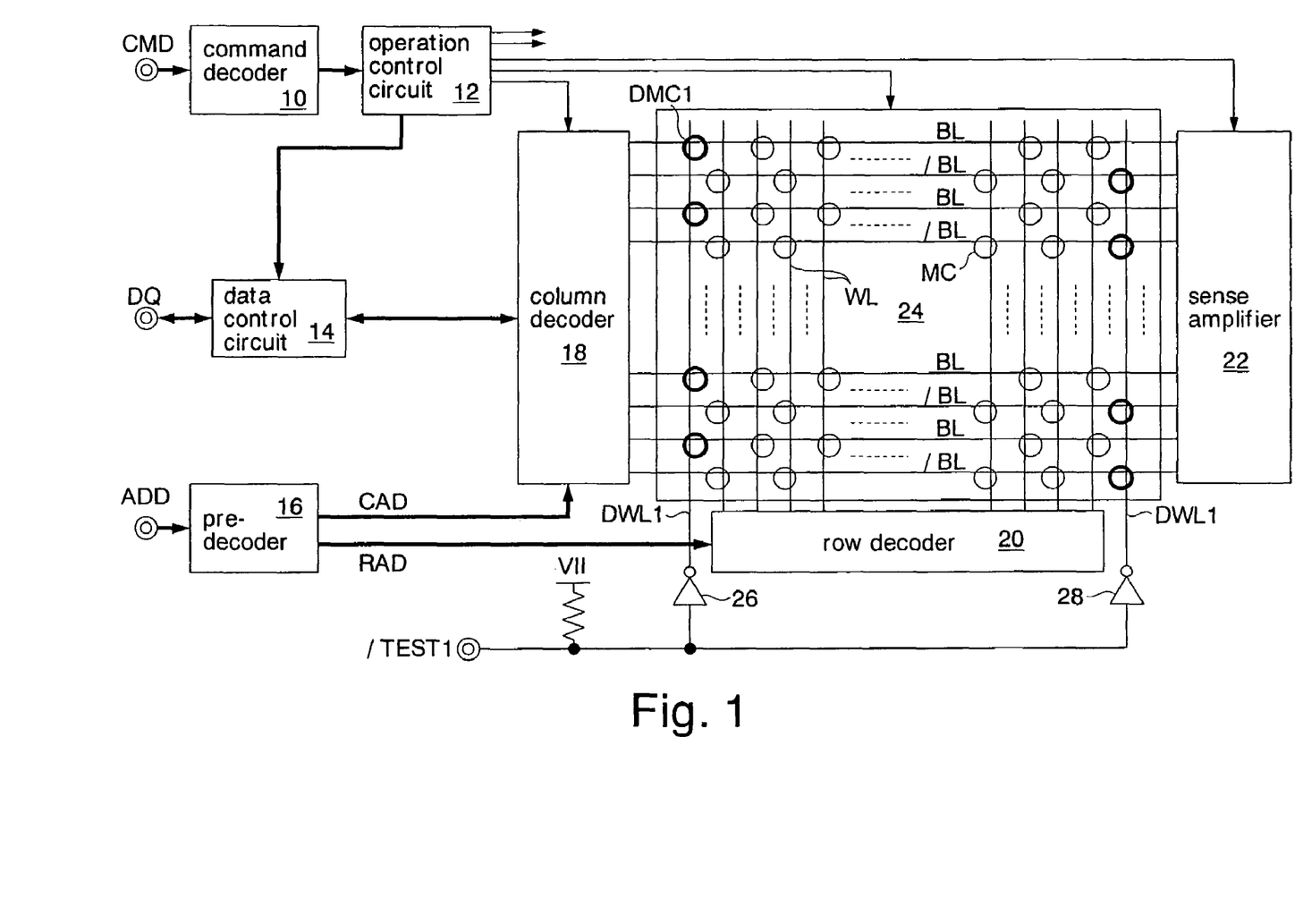
FIG. 1 is a block diagram of a semiconductor memory according to a first embodiment of the present invention.

FIG. 1 shows a semiconductor memory according to a first embodiment of the present invention. This semiconductor memory is formed as a DRAM on a silicon substrate by using a CMOS process. The DRAM includes a command decoder 10, an operation control circuit 12, a data control circuit 14, a pre-decoder 16, a column decoder 18, a row decoder 20, a sense amplifier 22, and a memory cell array 24.

The command decoder 10 receives a command signal CMD (e.g., a row address strobe signal /RAS, a column address strobe signal /CAS, and a chip select signal /CS) supplied via a command terminal, decodes a command (e.g., an access command (a read command and a write command) and a refresh command) indicated by the received command signal CMD, and outputs an internal command signal corresponding to the decoding result to the operation control circuit 12.

The operation control circuit 12 generates a plurality of operation control signals for operating the memory cell array 24 in accordance with the internal command signal from the command decoder 10, and outputs those operation control signals to the data control circuit 14, the column decoder 18, the row decoder 20, the sense amplifier 22 and the memory cell array 24.

The data control circuit 14 includes an output buffer and an input buffer that are not shown. The output buffer receives data read from a memory cell MC during a read operation and outputs the received data to a data terminal DQ. The input buffer receives data to be written, via the data terminal DQ during a write operation and outputs the received data to a bit line pair BL and /BL via a column switch (not shown).

The pre-decoder 16 pre-decodes an address signal ADD supplied via an address terminal and outputs a column address signal CAD and a row address signal RAD that are pre-decoded signals. The column decoder 18 operates in synchronization with the operation control signal in order to select a bit line pair BL and /BL, and turns on a column switch (not shown) indicated by the column address signal CAD. The row decoder 20 operates in synchronization with the operation control signal, and selects a word line WL indicated by the row address signal RAD.

The sense amplifier 22 operates in synchronization with the operation control signal (sense amplifier activating signal), so as to amplify the magnitude of a signal of data on the bit line BL or /BL. The data amplified by the sense amplifier 22 is transmitted to the data control circuit 14 via the column switch during the read operation, while being written onto a memory cell MC via the bit line BL or /BL during the write operation.

The memory cell array 24 includes a plurality of volatile dynamic memory cells MC (real memory cells) arranged in a matrix and a plurality of word lines WL (real signal lines) and a plurality of bit lines BL and /BL (complementary bit line pairs) that are connected to the memory cells MC. The real memory cells MC connected to each word line WL forms a real memory cell row.

On the left and right sides of the memory cell array 24 in FIG. 1 (on the outside of a region in which the memory cells MC are arranged), dummy word lines DWL1 (the first dummy signal lines) are respectively arranged to be parallel to the word lines WL. To the dummy word line DWL, dummy memory cells DMC1 (the first dummy memory cells) shown by bold circles in FIG. 1 are connected. The dummy memory cells DMC1 have the same shape (layout) and electric characteristics as the memory cells MC. The dummy memory cells DMC1 are arranged to be adjacent to the memory cells connected to the leftmost word line WL or the memory cells connected to the rightmost word line WL. The dummy memory cells DMC1 are also connected to the bit lines BL (or /BL) that are shared by both the dummy memory cells DMC1 and the memory cells MC. During a test mode, data of a high logical level or a low logical level can be written onto the dummy memory cell DMC1. The test mode in this embodiment is a burn-in test mode in which, in order to remove an initial failure product, a DRAM is operated at a high temperature and a high voltage.

In this example, during a normal operation mode, one of the word lines WL is selected in accordance with the command signal CMD and the address signal ADD, and a memory cell MC connected to one of the bit lines BL and /BL is accessed. In other words, by selecting one word line WL, one of the read operation, write operation, and refresh operation is carried out.

The dummy word lines DWL1 are connected to a test terminal /TEST1 via inverters (voltage setting circuit) 26 and 28, respectively. The test terminal /TEST1 is formed as a test pad with which a probe of an LSI tester is brought into contact, for example. During the test mode, when level L (low logical level) is supplied to the test terminal /TEST1, each dummy word line DWL1 is set to level H (high logical level; the second voltage). During the test mode, when level H is supplied to the test terminal /TEST1, each dummy word line DWL1 is set to level L (the first voltage). That is, each dummy word line DWL1 is set to level H (the second voltage) or level L (the first voltage) during the test mode.

Moreover, during the normal operation mode, the test terminal /TEST1 is placed in a floating state. Thus, the dummy word lines DWL1 are set to level L by a pull-up resistor connected to the inputs of the inverters 26 and 28. In other words, during the normal operation mode, the inverters 26 and 28 fix the level of the dummy word lines DWL1 to level L (ground voltage; the first voltage). In this manner, the transfer transistors of the dummy memory cells DMC1, shown in FIG. 2, are turned off, so that the dummy memory cells DMC1 are placed and held in the non-written state.

Figure 2:
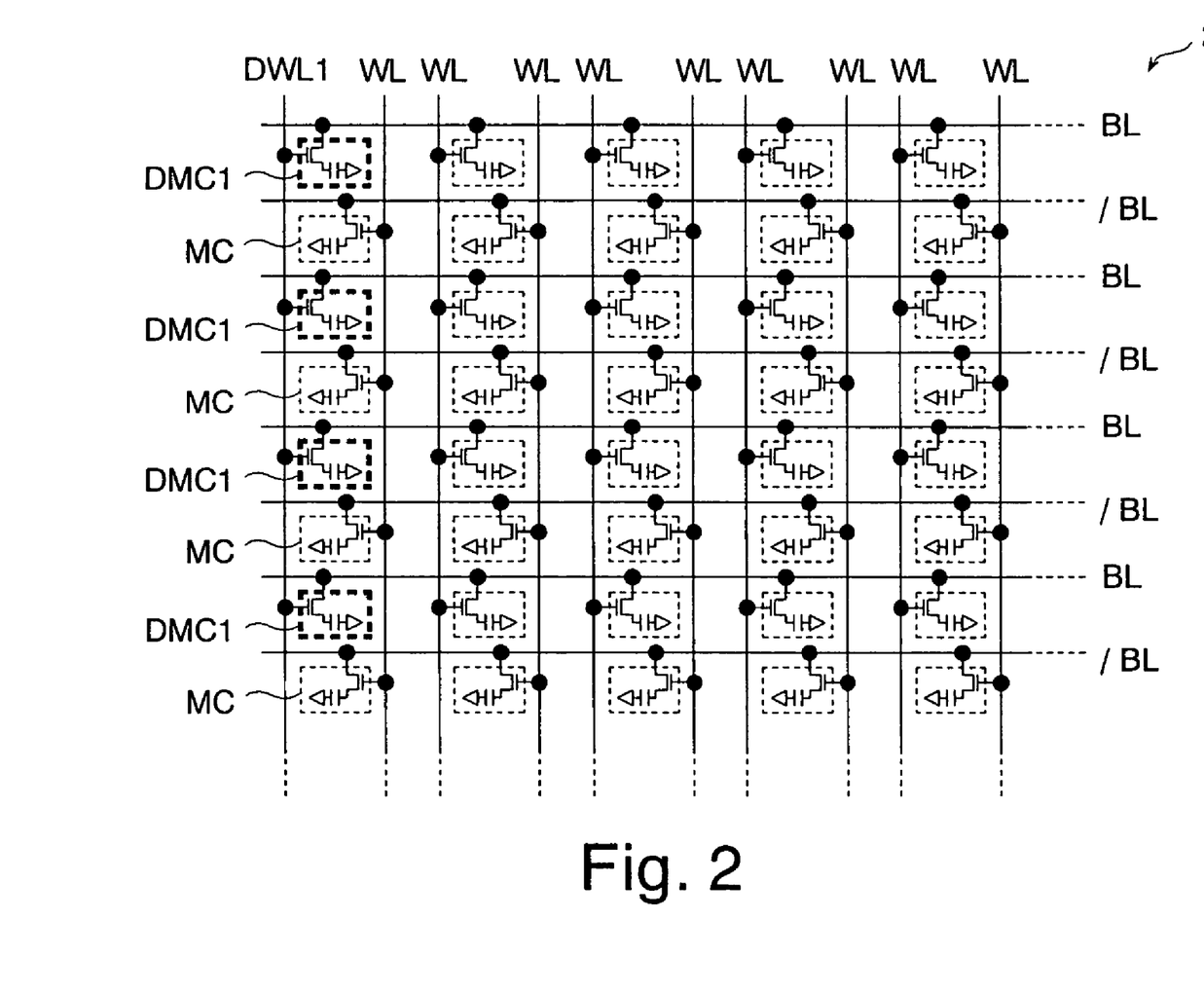
FIG. 2 is a circuit diagram showing details of a main part of a memory cell array shown in FIG. 1.

FIG. 2 shows details of an upper left part of the memory cell array 24 shown in FIG. 1. The dummy memory cells DMC1, surrounded by bold broken line in FIG. 2, are arranged in such a manner that they sandwich the memory cells MC connected to the leftmost word line WL therebetween and they are adjacent to those memory cells MC. The dummy memory cells DMC1 are arranged on the left side of the memory cells MC connected to the second word line WL from the left end so as to be adjacent to those memory cells MC.

Each of the memory cells MC and dummy memory cells DMC1 includes a capacitor for retaining data as electric charges and a transfer transistor (transfer switch), arranged between the capacitor and the bit line BL (or /BL), for charging or discharging the capacitor. The gate of the transfer transistor is connected to the word line WL or the dummy word line DWL1. One end of the capacitor is connected to an internal voltage line VPR having a voltage (precharge voltage) that is a half of an internal supply voltage VII, for example. The other end of the capacitor is connected to the bit line BL or /BL via the transfer transistor. The internal supply voltage VII is generated by reducing an external supply voltage by means of an internal voltage generating circuit.

The dynamic memory cell MC used in a DRAM stores data as electric charges. For example, a state in which the capacitor stores electric charges is state H, while a state in which no electric charge is stored in the capacitor is state L. The electric charges stored in the memory cell MC are lost gradually. Thus, state H of the memory cell MC changes into state L with the time. Therefore, in order to retain state H, a DRAM requires a refresh operation (operation for rewriting data).

In order to make data retention time (retention time of state H) of the memory cell MC longer, it is preferable to increase the capacitance of the capacitor. When the area of electrodes of the capacitor is increased in order to increase the capacitance, the shape of the capacitor becomes three-dimensional and complicated. Therefore, the distance between the adjacent memory cells MC becomes smaller, thus allowing a failure caused by abnormal leak between the memory cells to occur easily. In other words, in a semiconductor memory including the dynamic memory cell, such as a DRAM, a leak failure between memory cells can occur more easily, as compared with another type of semiconductor memory.

Figure 3:
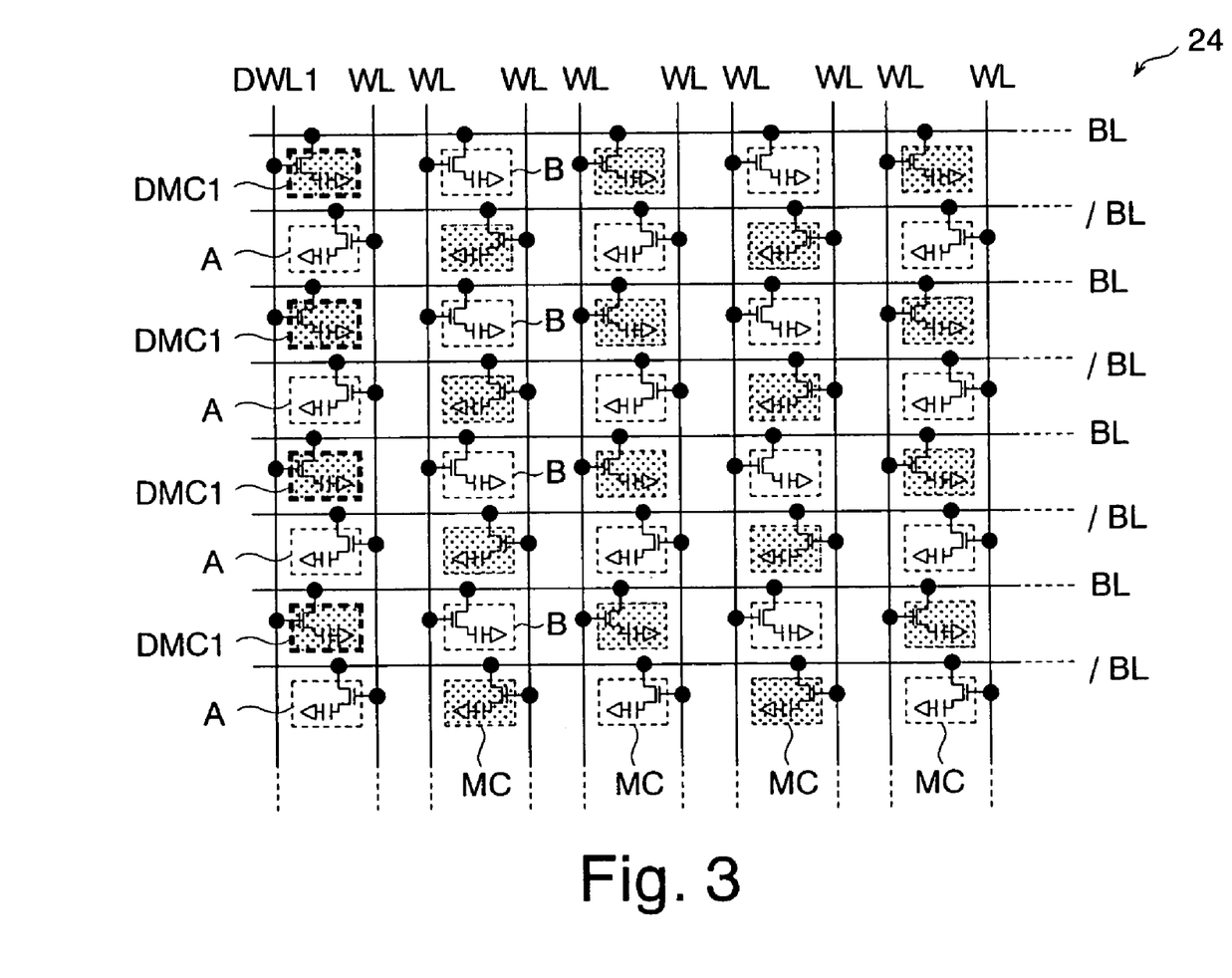
FIG. 3 shows a burn-in test in the first embodiment.

FIG. 3 generally shows a burn-in test in the first embodiment of the present invention. The burn-in test is carried out by using a wafer on which a plurality of DRAMs are connected, for example. First, the test terminal /TEST1 shown in FIG. 1 is fixed to level L by an LSI tester or the like, and the DRAM is moved from the normal operation mode to the test mode (burn-in test mode). In the burn-in test, an external supply voltage supplied to the DRAM is set to a higher voltage (e.g., 6V) than a voltage used in a normal operation (e.g., 3V). During the test mode, an internal supply voltage VII becomes higher in proportion to the external supply voltage. By level L supplied to the test terminal /TEST1, the inverter 26 (or 28) switches the voltage output to the dummy word line DWL1 from level L (the first voltage=ground voltage) to level H (the second voltage=external supply voltage VDD). The dummy word line DWL1 is kept at level H during the test mode.

Next, level H is written onto the memory cells MC connected to the bit line BL, and level L is written onto the memory cells MC connected to the bit line /BL. At this time, the dummy word line DWL1 is fixed at level H. Thus, level H (test data) is also written onto the dummy memory cells DWL1 via the bit line BL. That is, given test data can be written onto the dummy memory cell DMC1 by changing the voltage of the bit line /BL. Writing of data onto the memory cell MC uses a higher voltage (e.g., 5V) than the internal supply voltage that is usually supplied (e.g., 2V), and is cyclically performed with a predetermined interval. Then, the data is read out and checked whether or not the written data is held.

In FIG. 3, level H is written onto the memory cells MC and the dummy memory cells DMC1 that are shown with hatching (i.e., they are placed in state H), and level L is written onto the memory cells MC with no hatching (i.e., they are placed in state L). As shown in FIG. 3, data of a so-called checkerboard pattern is written in the memory cell array 24. By writing the data of a checkerboard pattern, the memory cells MC adjacent to the focused memory cell MC, i.e., the upper, lower, left and right memory cells MC with respect to the focused memory cell MC, retain a level opposite to that retained by the focused memory cell MC. Thus, stress is applied between the memory cells MC because of a voltage difference generated therebetween (especially between the capacitors of the memory cells), so that a leak failure that is supposed to occur in the memory cell MC is made apparent. That is, an acceleration test is performed. The memory cell MC in which the leak failure occurred as a result of the acceleration test can be easily detected by writing data onto the memory cell MC and then reading out the data after a predetermined time.

Here, it is assumed that the real memory cells MC arranged between the dummy memory cells DMC1 are memory cells A and the real memory cells MC connected to the second word line WL from the left end are memory cells B. When level L is written onto a memory cell A, level H is written onto the memory cell MC and the dummy memory cells DMC1 arranged at positions surrounding the memory cell A (i.e., the right memory cell MC and the upper and lower dummy memory cells DMC1). Similarly, when level L is written onto a memory cell B, level H is written onto all of the memory cells MC and the dummy memory cell DMC1 that are arranged to surround the memory cell B (i.e., the left dummy memory cell DMC1 and the upper, lower and right memory cells MC). Thus, to the real memory cells MC arranged at left and right ends of the memory cell array 24, stress equivalent to that applied to the memory cell MC in the inner region of the memory cell array 24 is applied. That is, stress is surely applied to the memory cells A and B, so that the acceleration test is performed.

Figure 4:
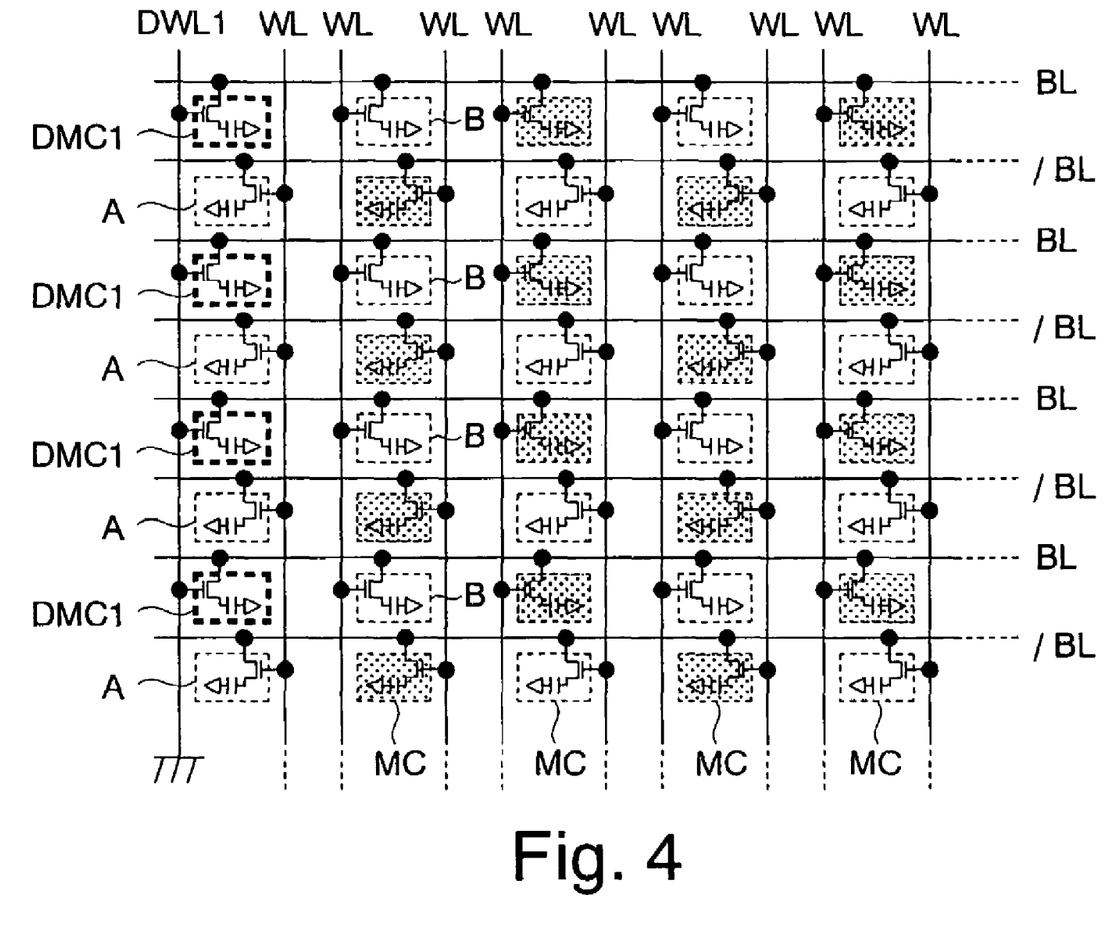
FIG. 4 shows a burn-in test before the present invention.

FIG. 4 generally shows a burn-in test that was performed before the present invention. Before the present invention, the dummy word line DWL 1 was connected to a ground line. Thus, no data can be written onto the dummy memory cell DMC1 and the dummy memory cell DMC1 is always in state L. In this case, it is not possible to apply stress that is equivalent to that applied to the memory cells MC in the inner region of the memory cell array 24, to the memory cells A and B arranged at the ends of the memory cell array 24. Therefore, it is not possible to make one of the memory cells A and B that is supposed to have a failure apparent. As a result, if a failure occurs in such a memory cell in a latter half of the test process, the test cost increases. Alternatively, a DRAM that was shipped as a non-defective product may become defective on the market.

As described above, in the present embodiment, the dummy memory cells DMC1 having the same shape and characteristics as the real memory cells MC and the dummy word lines DWL1 for placing the dummy memory cells DMC1 in state H are arranged on both sides of the memory cell array 24. Therefore, a leak failure in the outermost real memory cell MC in the memory cell array 24 can be detected. By removing a DRAM having a leak failure as a defective product in the first half of the test process formed by a plurality of tests, it is unnecessary to test the defective product in a latter half of the test process, thus reducing the test cost. Moreover, it is also possible to prevent the DRAM having the leak failure from being shipped.

When the present invention is applied to a DRAM, a leak failure between capacitors of a real memory cell MC and a dummy memory cell DMC1 that are adjacent to each other can be surely detected. The shape of the capacitor can be easily changed by a slight change of a fabrication condition and leak can easily occur between the adjacent capacitors. Therefore, the detection of the leak failure is important.

The burn-in test is performed by applying a voltage directly to the test terminal /TEST1. Thus, the acceleration test for the aforementioned leak failure can be easily performed by connecting the test terminal /TEST1 to an LSI tester or the like, so that the leak failure can be easily detected.

By performing the burn-in test using the present invention and removing as a defective product a DRAM including a real memory cell MC in which a failure is to occur, it is possible to prevent the occurrence of the leak failure on the market.

During the test mode, the dummy word line DWL1 is set to level H, the transfer transistor is turned on, and level H is written onto the dummy memory cells DMC1. Thus, stress can be applied between the capacitors of the real memory cell MC and the dummy memory cell DMC1 that are adjacent to each other, thereby a leak failure can be detected. Moreover, during the normal operation mode, the dummy word line DWL1 is set to level L and the transfer transistor is turned off. Thus, no data is written onto the dummy memory cells DMC1. Therefore, it is possible to prevent strong stress from being applied between the real memory cell MC and the dummy memory cell DMC1 adjacent thereto.

Figure 5:
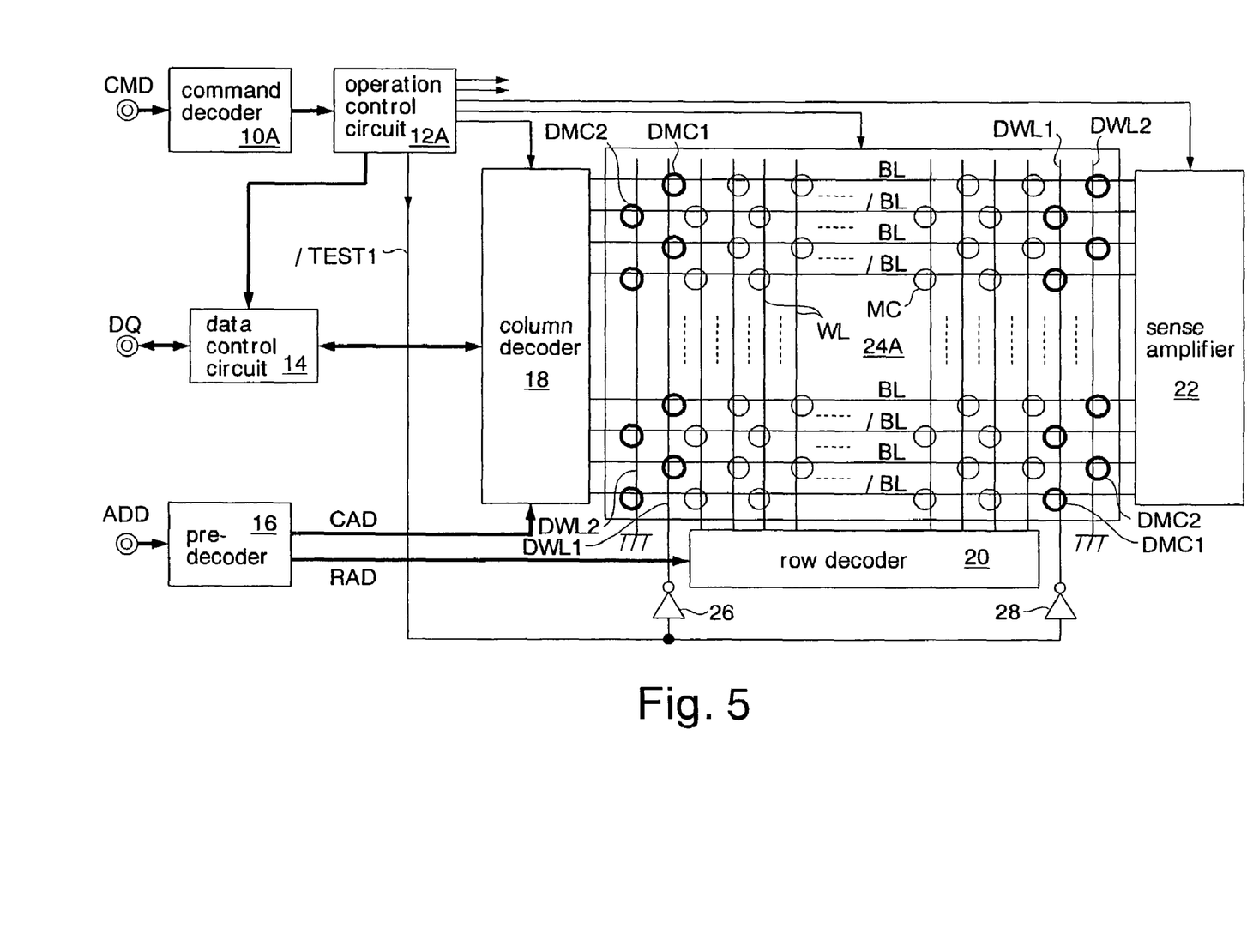
FIG. 5 is a block diagram of a semiconductor memory according to a second embodiment of the present invention.

FIG. 5 shows a semiconductor memory according to a second embodiment of the present invention. The same components as those described in the first embodiment are labeled with the same reference numerals, and the detailed description thereof is omitted. This semiconductor memory is formed as a DRAM on a silicon substrate by using a CMOS process. In this embodiment, the command decoder 10, the operation control circuit 12, and the memory cell array 24 of the first embodiment are replaced with a command decoder 10A, an operation control circuit 12A, and a memory cell array 24A, respectively. In addition, no test terminal /TEST1 is included because the test signal /TEST1 is output from the operation control circuit 12A.

The command decoder 10A has a function of decoding a plurality of test commands, in addition to the function of the command decoder 10 of the first embodiment. The test command is recognized by a combination with a command signal (illegal command) that is not used in the normal operation. When the test command was recognized, the DRAM (the operation control circuit 12A) is moved from the normal operation mode to the test mode. When receiving the test command from the command decoder 10A, the operation control circuit 12A changes the test signal /TEST1 from level H to level L in response to the test command. That is, the voltage of the test signal /TEST1 is set without forming an exclusive test terminal. The operation control circuit 12A and the inverters 26 and 28 also operate as a voltage setting circuit for switching the level of the dummy word line DWL1 from level L (the first voltage) to level H (second voltage) during the test mode.

The memory cell array 24A further includes a dummy word line DWL2 (the second dummy signal line) on the outside of each dummy word line DWL1 of the first embodiment (the first dummy signal lines). The dummy word line DWL2 is connected to a grounding wire. To the dummy word line DWL2, dummy memory cells DMC2 (the second dummy memory cells) are connected. The dummy memory cells DMC1 and DMC2 have the same shape (layout) and electric characteristics as those of the real memory cell MC.

Figure 6:
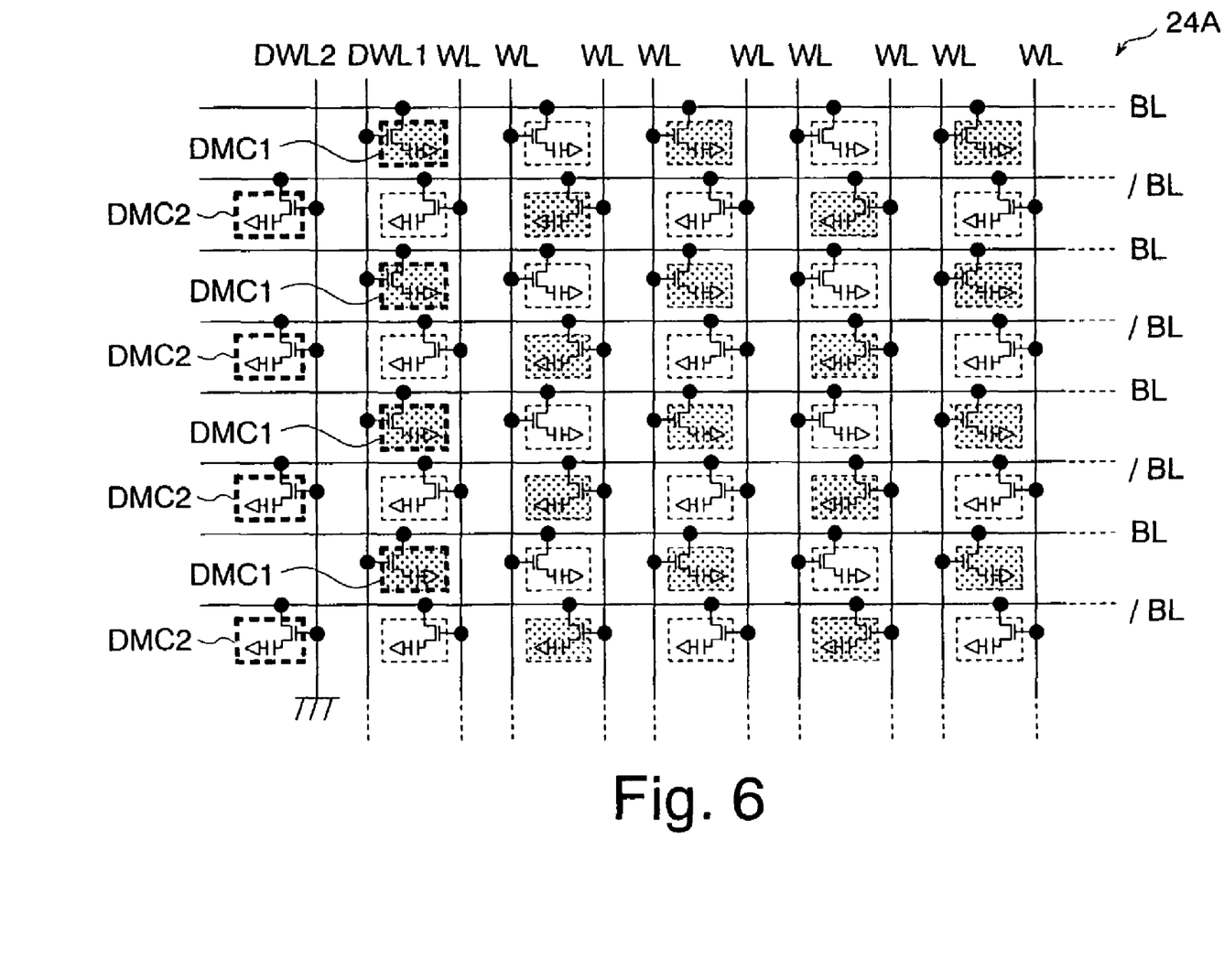
FIG. 6 shows a burn-in test in the second embodiment.

FIG. 6 generally shows a burn-in test in the second embodiment. FIG. 6 shows an upper left part of the memory cell array 24A shown in FIG. 5, in detail. In this example, data of a so-called checkerboard pattern is also written onto the real memory cells MC and the dummy memory cells DMC1, as in the first embodiment. However, no data is written onto the dummy memory cells DMC2 connected to the dummy word line DWL2. Thus, the dummy memory cells DMC2 are in state L.

In this embodiment, in order to write data of level H onto the dummy memory cell DMC1 that is required for applying stress to the real memory cell MC, the test signal /TEST1 is supplied to the dummy word line DWL1 corresponding to the dummy memory cell DMC1, and the dummy word line DWL2 connected to the dummy memory cells DMC2 onto which no data of level H is to be written is connected to the grounding wire. Since the dummy word line DWL2 is not driven, the drivability of the inverters 26 and 28 can be made small, thus reducing the chip size of the DRAM.

In this embodiment, the same effects as those described in the first embodiment can also be achieved. In addition, in this embodiment, the DRAM is moved from the normal operation mode to the test mode so as to change the voltage of the dummy word line DWL1 from the ground voltage to the internal supply voltage VII (that is higher than the voltage during the normal operation mode), when receiving the test command via the command decoder 10. Thus, the burn-in test can be carried out without forming an exclusive test terminal. That is, the burn-in test can be carried out only with the terminal used in the normal operation mode, so that a leak failure can be detected. Therefore, it is possible to prevent the increase of the chip size of the DRAM.

During the test mode, the inverters 26 and 28 only drive the dummy word line DWL1 connected to the dummy memory cells DMC1 adjacent to the real memory cells MC, but do not drive the dummy word line DWL2. Thus, the drivability of the inverters 26 and 28 can be minimized. Therefore, the chip size of the DRAM can be reduced.

Figure 7:
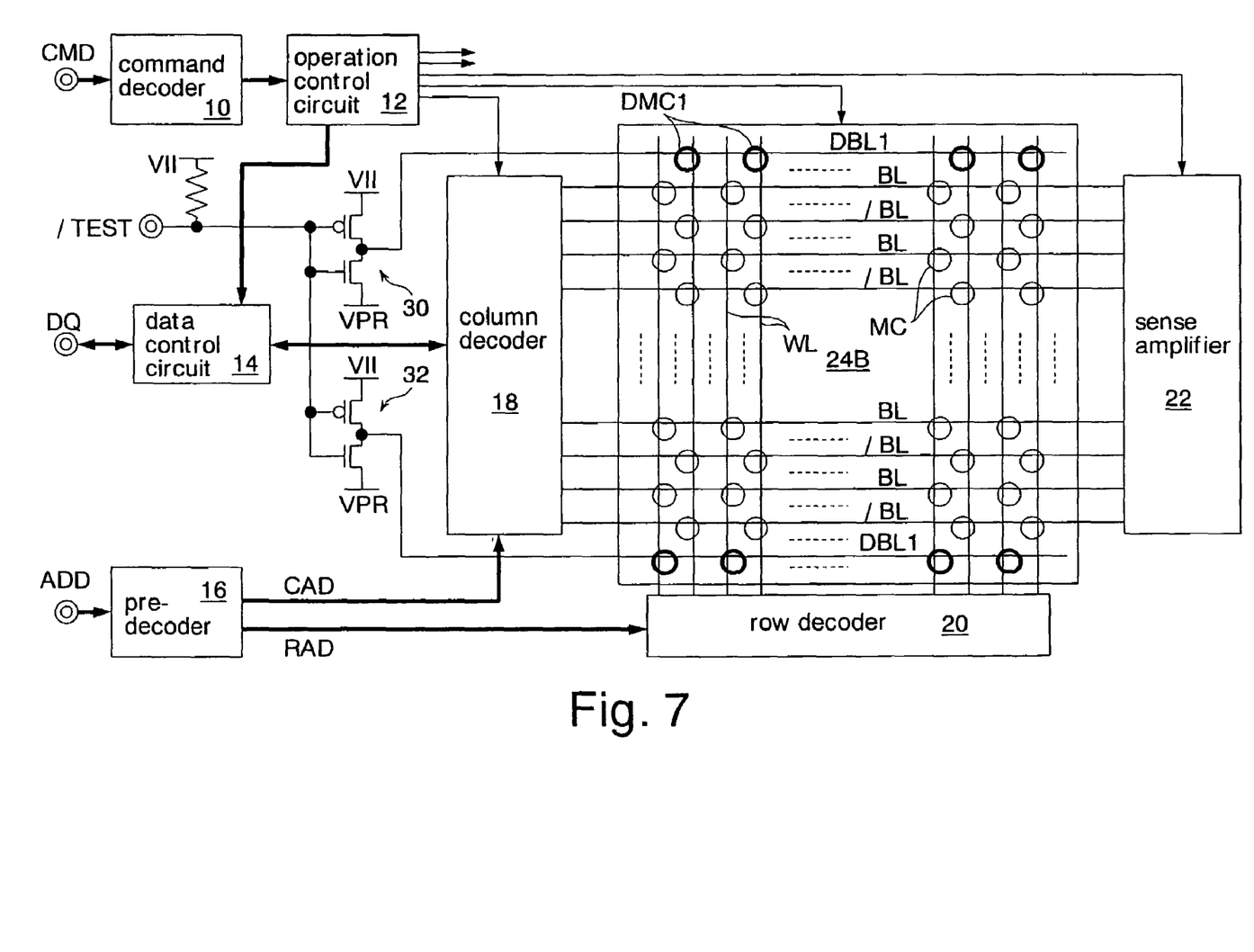
FIG. 7 is a block diagram of a semiconductor memory according to a third embodiment of the present invention.

FIG. 7 shows a semiconductor memory according to a third embodiment of the present invention. The same components as those described in the first embodiment are labeled with the same reference numerals and the detailed description thereof is omitted.

This semiconductor memory is formed as a DRAM on a silicon substrate by using a CMOS process. In this embodiment, the memory cell array 24 of the first embodiment is replaced with a memory cell array 24B. In addition, the DRAM includes a CMOS inverter for inverting the logical level of the test signal /TEST and supplying the inverted level to a dummy bit line DBL1 (the first dummy signal line).

The memory cell array 24B includes no dummy word line DWL1. Instead, dummy bit lines DBL1 are arranged on the upper and lower sides in FIG. 7 (i.e., on the outside of the region where the real memory cells MC are arranged) to be parallel to the bit lines BL and /BL (real signal lines). A memory cell row is formed by memory cells MC connected to each bit line BL or /BL. To the dummy bit line DBL1, dummy memory cells DMC1 (the first dummy memory cells) represented by bold circles in FIG. 7 are connected. The dummy memory cells DMC1 have the same shape (layout) and electric characteristics as those of the memory cell MC. The dummy memory cells DMC1 are arranged to be adjacent to the memory cells connected to the uppermost bit line BL or the lowermost bit line /BL. The dummy memory cells DMC1 are connected to the word line WL that is shared by the adjacent memory cells MC.

The dummy bit lines DBL1 are connected to the test terminal /TEST via CMOS inverters 30 and 32 (voltage setting circuit), respectively. The test terminal /TEST is formed as a test pad with which a probe of an LSI tester is brought into contact, for example. Each dummy bit line DBL1 is set to level H (internal supply voltage VII; the second voltage) when level L is supplied to the test terminal /TEST.

Each dummy bit line DBL1 is set to an internal voltage VPR (precharge voltage; the first voltage) that is half of the internal supply voltage VII when level H is supplied to the test terminal /TEST. The dummy bit line DBL1 is set to the internal voltage VPR by a pull-up resistor connected to the inputs of the CMOS inverters 30 and 32 when the test terminal /TEST is in a floating state.

Figure 8:
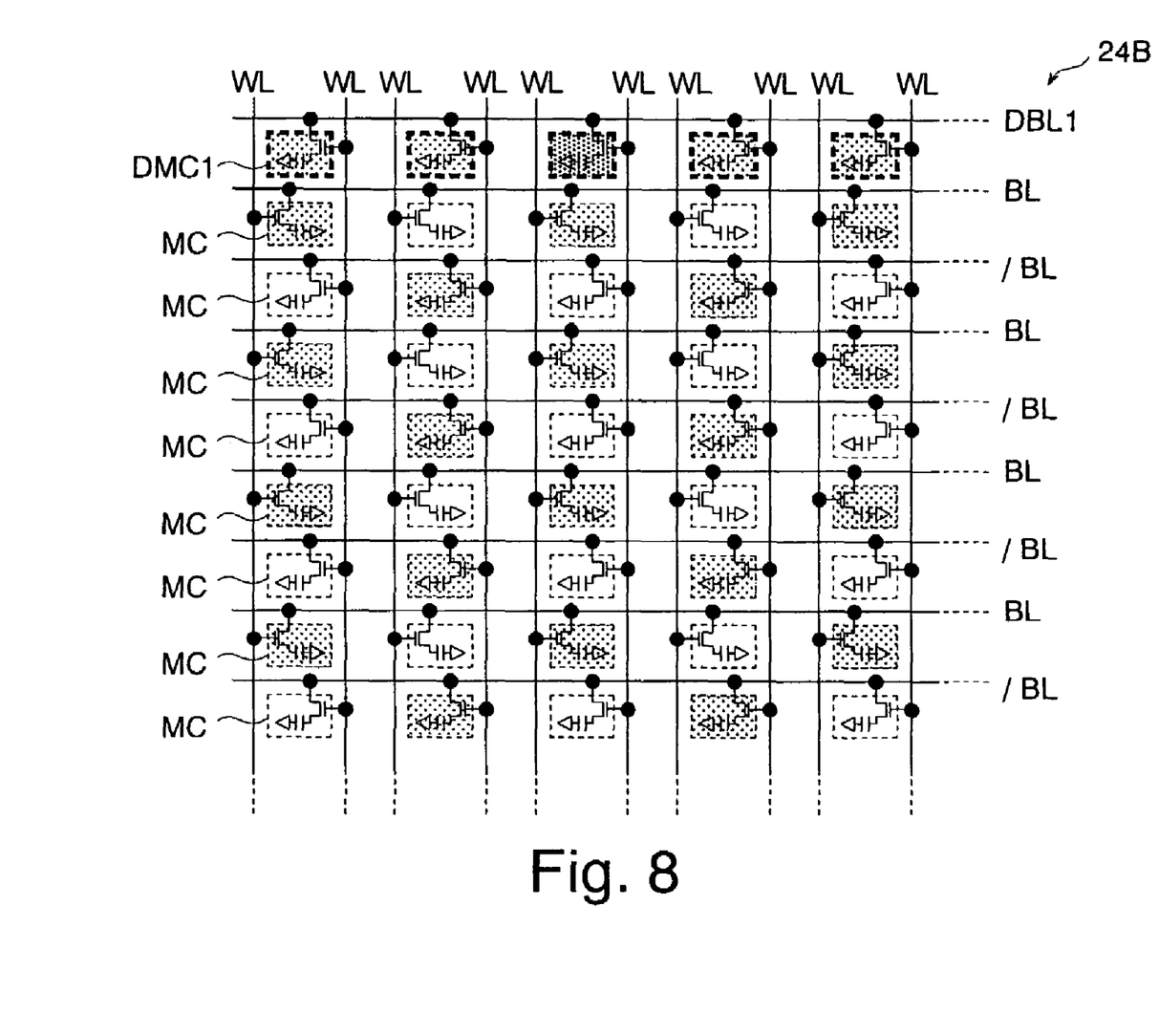
FIG. 8 shows a burn-in test in the third embodiment.

FIG. 8 generally shows a burn-in test in the third embodiment. FIG. 8 shows an upper left part of the memory cell array 24B shown in FIG. 7, in detail. In this example, a so-called checker board pattern is also written onto the real memory cells MC as in the first embodiment. However, onto all the dummy memory cells DMC1 connected to the dummy bit line DBL1, data of level H is written.

It is assumed that one of the memory cells MC connected to the uppermost bit line BL is focused. As shown in FIG. 8, when data of level L was written onto the focused memory cell MC, all of the upper dummy memory cell DMC1 and the lower, left and right memory cells MC hold data of a level opposite to that of the data of the focused memory cell MC. Thus, stress is applied between the memory cells MC (especially between the capacitors of the memory cells). The application of stress makes a memory cell MC in which a failure is to occur to apparent. That is, an acceleration test is performed.

Figure 9:
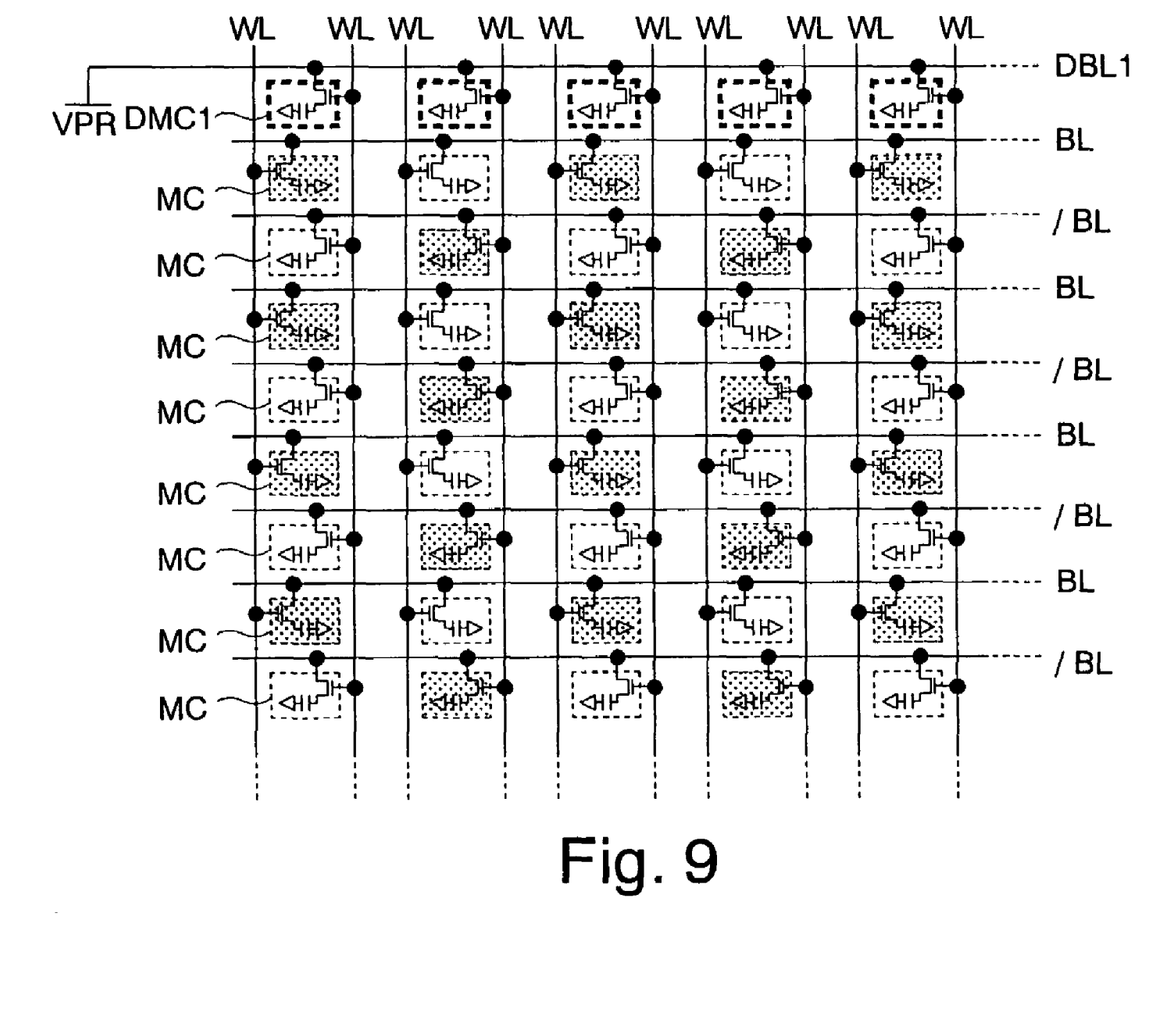
FIG. 9 shows a burn-in test before the present invention.

FIG. 9 generally shows a burn-in test that was performed before the present invention. Before the present invention, the dummy bit line DBL1 was connected to a precharge voltage line VPR. Thus, no data can be written onto the dummy memory cells DMC1, and the dummy memory cells DMC1 are always held in state L. In this case, it is not possible to apply sufficient stress to one (focused memory cell) of the memory cells MC connected to the uppermost bit line BL that has data of level L. As a result, as in the first embodiment (FIG. 4), the memory cell MC in which a failure is to occur cannot be made apparent.

In this embodiment, the same effects as those described in the first embodiment can be also achieved. Moreover, in this embodiment, during the test mode, the dummy bit line DBL1 is set to the internal supply voltage VII, and data of level H is written onto the dummy memory cells DMC1. Thus, stress can be applied between the capacitors of the real memory cell MC and the dummy memory cell DMC1 adjacent thereto, so that a leak failure can be detected. In addition, during the normal operation mode, the dummy bit line DBL1 is set to the precharge voltage VPR. Thus, no data is written onto the dummy memory cells DMC1. Therefore, it is possible to prevent strong stress from being applied between the real memory cell MC and the dummy memory cell DMC1 adjacent thereto.

Figure 10:
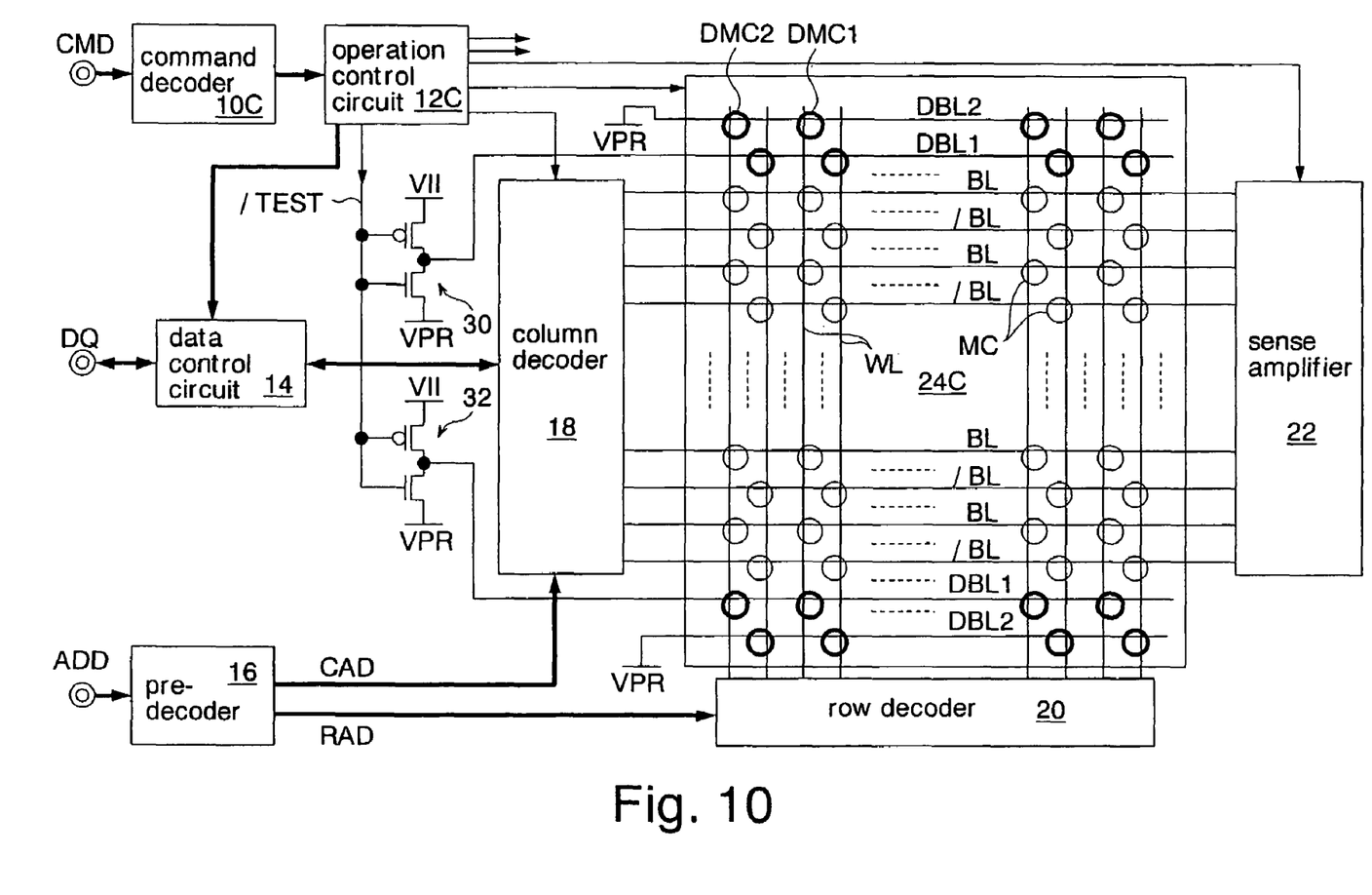
FIG. 10 is a block diagram of a semiconductor memory according to a fourth embodiment of the present invention.

FIG. 10 shows a semiconductor memory according to a fourth embodiment of the present invention. The same components as those described in the first and third embodiments are labeled with the same reference numerals, and the detailed description thereof is omitted. The semiconductor memory is formed as a DRAM on a silicon substrate by using a CMOS process. In this embodiment, the command decoder 10, the operation control circuit 12, and the memory cell array 24 of the first embodiment are replaced with a command decoder 10C, an operation control circuit 12C, and a memory cell array 24C, respectively.

The command decoder 10C has the function of the command decoder 10 of the first embodiment and further has a function of decoding a plurality of test commands. The test command is recognized by a combination with a command signal (illegal command) that is not used in the normal operation. The DRAM is moved from the normal operation mode to the test mode when the test command was recognized. The operation control circuit 12C changes the test signal /TEST from level H to level L when receiving the test command from the command decoder 10C. The test signal /TEST is supplied to the inputs of the CMOS inverters 30 and 32, as in the third embodiment. The operation control circuit 12C and the inverters 30 and 32 also work as a voltage setting circuit for switching the voltage of the dummy bit line DBL1 from the precharge voltage VPR (the first voltage) to the internal supply voltage VII (the second voltage).

The memory cell array 24C further includes a dummy bit line DBL2 (the second dummy signal line) on the outside of each dummy bit line DBL1 (the first dummy signal line) of the third embodiment. The outer dummy bit line DBL2 is connected to the precharge voltage line VPR. To the dummy bit line DBL2, dummy memory cells DMC2 (the second dummy memory cells) are connected. The dummy memory cells DMC1 and DMC2 have the same shape (layout) and electric characteristics as those of the real memory cell MC.

In this embodiment, as in the second embodiment, in order to write data of level H onto the dummy memory cell DMC1 that is required for applying stress to a real memory cell MC, the internal supply voltage VII (level H) is supplied to the dummy bit line DBL1. On the other hand, the dummy bit line DBL2, that is connected to the dummy memory cells DMC2 onto which data of level H is not to be written, is connected to the precharge voltage line VPR. Since the dummy bit line DBL2 is not driven, the drivability of the inverters 30 and 32 can be made small, thus reducing the chip size of the DRAM.

In this embodiment, the same effects as those described in the first, second, and third embodiments can be also achieved.

In the aforementioned embodiments, an example has been described in which the present invention is applied to a DRAM. However, the present invention is not limited thereto. For example, the present invention may be applied to other semiconductor memories, such as a pseudo SRAM and an SRAM.

In the aforementioned embodiments, an example has been described in which the present invention is applied to a burn-in test. However, the present invention is not limited thereto. For example, the present invention may be applied to a write/read test for detecting a failure (leak failure) of a memory cell. This test allows easy detection of the failure of the outermost memory cell MC.

In the first embodiment, an example has been described in which the memory cell array 24 includes the dummy word lines DWL1 only. However, the present invention is not limited thereto. For example, the memory cell array 24A of the second embodiment including the dummy word lines DWL1 and DWL2 may be applied to the first embodiment.

In the third embodiment, an example has been described in which the memory cell array 24 includes the dummy bit line DBL1 only. However, the present invention is not limited thereto. For example, the memory cell array 24C of the fourth embodiment, which includes the dummy bit lines DBL1 and DBL2, may be applied to the third embodiment.

In the third and fourth embodiments, an example has been described in which during the test mode the internal supply voltage VII is supplied to the dummy bit line DBL1 in order to write data of level H onto the dummy memory cell DMC1. However, the present invention is not limited thereto. For example, during the test mode, in order to write data of level H or level L onto the dummy memory cell DMC1, the internal supply voltage VII or the ground voltage may be supplied to the dummy bit line DBL1 in accordance with the test command. In this case, the dummy memory cell DMC1 can be placed in state L forcibly. Thus, test efficiency can be improved.

The invention is not limited to the above embodiments and various modifications may be made without departing from the spirit and scope of the invention. Any improvement may be made in part or all of the components.

What is claimed is:

1. A semiconductor memory comprising:
   a plurality of real memory cells arranged in a matrix;

a plurality of real signal lines connected respectively to a plurality of real memory cell rows each of which is formed of the real memory cells arranged in one direction;

a first dummy signal line wired along said real signal lines on an outside of a region in which said real memory cells are arranged;

first dummy memory cells connected to said first dummy signal line, being adjacent to said real memory cells, and to which a predetermined logical level is writable during a test mode; and a voltage setting circuit setting said first dummy signal line to a first voltage to keep said first dummy memory cells in a non-written state during a normal operation mode, and setting said first dummy signal line to a second voltage to write test data onto said first dummy memory cells during the test mode, wherein:

said real memory cells and said first dummy memory cells each include a memory element and a transfer switch connected to the memory element;

said real signal lines are real bit lines connected to the transfer switches of said real memory cells;

said first dummy signal line is a dummy bit line connected to the transfer switches of said first dummy memory cells;

said first voltage is a precharge voltage that is a reset voltage for said real bit lines and said dummy bit line; and said second voltage is a voltage for writing a high logical level onto said real memory cells and said first dummy memory cells.

2. The semiconductor memory according to claim 1, wherein the first dummy memory cells have a same shape and characteristic as those of said real memory cells.

3. The semiconductor memory according to claim 1, further comprising:
an operation control circuit controlling an access to said real memory cells.

4. The semiconductor memory according to claim 1, wherein the test mode is a burn-in test mode.

5. The semiconductor memory according to claim 1, wherein:
the memory element is a capacitor for holding data as electric charges; and
the real memory cells and said first dummy memory cells are dynamic memory.

6. The semiconductor memory according to claim 1, further comprising:
a terminal receiving a predetermined voltage during the test mode, wherein
said voltage setting circuit outputs the second voltage to said first dummy signal line in accordance with a predetermined voltage received by the terminal.

7. The semiconductor memory according to claim 1, further comprising:
a command decoder decoding a command signal configured to receive a test command for ordering a shift of the semiconductor memory from the normal mode to the test mode and to change a voltage output from said voltage setting circuit from the first voltage to the second voltage.

8. The semiconductor memory according to claim 1, wherein the precharge voltage is half of an internal supply voltage.

9. The semiconductor memory according to claim 1, wherein the real signal line is a bit line configured to read data from the real memory cell or write data to the real memory cell.

10. The semiconductor memory according to claim 1, further comprising:
at least one second dummy signal line wired on an outside of said first dummy signal line; and
second dummy memory cells connected to said second dummy signal line.

11. The semiconductor memory according to claim 1, wherein the semiconductor memory is a DRAM or a pseudo SRAM.

12. A semiconductor memory comprising:
a plurality of real memory cells;
a plurality of first real signal lines, connected respectively to the plurality of real memory cells and extended in a first direction, configured to select the real memory cell;
a plurality of second real signal lines connected respectively to the plurality of real memory cells and extended in a second direction orthogonal to the first direction, configured to read data from the real memory cell or write data to the real memory cell;
at least one first dummy signal line wired along the first real signal lines on an outside of a region where the plurality of first real signal lines are aligned, the at least one first dummy signal line is wired adjacent to and in parallel with the first signal lines;
first dummy memory cells connected to the first dummy signal line; and
a voltage setting circuit configured to set the first dummy signal line to a first voltage to keep said first dummy memory cells in a non-written state during a normal operation mode, and to set the first dummy signal line to a second voltage to write test data onto the first dummy memory cells during the burn-in test mode, the second voltage being higher than an internal supply voltage used in a normal operation.

13. The semiconductor memory according to claim 12, further comprising:
an operation control circuit controlling an access to said real memory cells.

14. The semiconductor memory according to claim 12, further comprising:
a terminal receiving a predetermined voltage during the test mode, wherein
said voltage setting circuit outputs the second voltage to said first dummy signal line in accordance with a predetermined voltage received by the terminal.

15. The semiconductor memory according to claim 12, further comprising:
a command decoder decoding a command signal configured to receive a test command for ordering a shift of the semiconductor memory from the normal mode to the test mode and to change a voltage output from said voltage setting circuit from the first voltage to the second voltage.

* * * * *